(12) United States Patent
Jang et al.

(10) Patent No.: US 6,392,909 B1
(45) Date of Patent: May 21, 2002

(54) SEMICONDUCTOR MEMORY DEVICE HAVING FIXED CAS LATENCY IN NORMAL OPERATION AND VARIOUS CAS LATENCIES IN TEST MODE

(75) Inventors: Tae-seong Jang, Suwon; Tae-jin Yoo, Bucheon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/818,876

(22) Filed: Mar. 27, 2001

(30) Foreign Application Priority Data

Sep. 20, 2000 (KR) .............................. 00-55206

(51) Int. Cl.$^7$ .............................. G11C 7/00; G11C 8/00
(52) U.S. Cl. .................... 365/25.7; 365/225.7; 365/233
(58) Field of Search .............................. 365/201, 225.7, 365/233

(56) References Cited

U.S. PATENT DOCUMENTS

| | | | |
|---|---|---|---|
| 5,835,445 A | * 11/1998 | Nakamura | 365/233 |
| 5,892,777 A | 4/1999 | Nesheiwat et al. | 365/201 |
| 5,905,690 A | 5/1999 | Sakurai et al. | 365/233 |
| 5,973,988 A | 10/1999 | Nakahira et al. | 365/233 |
| 6,081,476 A | * 6/2000 | Hotta | 365/233 |
| 6,084,803 A | * 7/2000 | Sredanovic et al. | 365/233 |
| 6,104,668 A | * 8/2000 | Lee et al. | 365/233 |
| 6,215,725 B1 | * 4/2001 | Komatsu | 365/233 |

FOREIGN PATENT DOCUMENTS

JP  6084350  3/1994

OTHER PUBLICATIONS

Abstract for JP6084350.

* cited by examiner

*Primary Examiner*—Trong Phan
(74) *Attorney, Agent, or Firm*—F. Chau & Associates, LLP

(57) ABSTRACT

A semiconductor memory device having a fixed CAS latency during a normal operation and various CAS latencies during a test mode. The semiconductor memory device a master signal generator for generating a master signal in response to a power-up signal and a latency test signal. A plurality of fuse information units generate fuse information signals in response to the power-up signal and the master signal. A plurality of mode register set (MRS) address information units receive address bits during an interval where an address window signal is activated to generate MRS address latch signals in response to a MRS addressing signal. A CAS latency determining unit generates CAS latency select signals in response to the fuse information signals and the MRS address latch signals, wherein the CAS latency select signals provide a fixed CAS latency during a normal mode of operation of the semiconductor device and varying CAS latencies during a test mode of operation of the semiconductor device.

19 Claims, 4 Drawing Sheets

SEMICONDUCTOR MEMORY DEVICE HAVING FIXED CAS LATENCY IN NORMAL OPERATION AND VARIOUS CAS LATENCIES IN TEST MODE

BACKGROUND

1. Technical Field

The present invention relates generally to a semiconductor memory device and, more particularly, to a system and method for providing various CAS latencies during testing of a synchronous dynamic random access memory (SDRAM) while providing a fixed CAS latency during operation of the SDRAM.

2. Description of Related Art

In general, the term CAS latency refers to the amount of time (typically measured in clock cycles) between a request to read memory and when the data is actually output. In particular, with SDRAMs, after a predetermined number of clock cycles have lapsed from an external command, e.g., a read command, that is received in synchronization with an external clock signal, data is output from a SDRAM memory cell corresponding to the command in synchronization with a clock signal. CAS latency refers to the number of required clock cycles that occur from the initial clock signal that is synchronized with the external command to the clock signal that is synchronized with the data output operation.

Conventionally, as illustrated in FIG. 1, the CAS latency for a SDRAM may be set by information bits that are stored in a mode register set (hereinafter referred to as "MRS") within the SDRAM. For example, when a MRS command of a SDRAM is input, predetermined address signals (such as values applied to addresses A4, A5, and A6) are stored in the MRS to thereby set the CAS latency. Thus, the CAS latency can be arbitrarily set for any desired time period such that a SDRAM outputs data after a predetermined number of clock cycles (corresponding to the set CAS latency) have occurred from the occurrence of a clock signal synchronized with an external (e.g., read) command.

Furthermore, in a system in which the SDRAM is used for a specific purpose and a fixed CAS latency is required, the CAS latency may be set as a fixed value. Even for implementations in which a fixed latency is required, it would be highly desirable to design the SDRAM such that various CAS latencies may be implemented to test whether the SDRAM will operate using such various CAS latencies after the fabrication process. Thus, there is a need for a semiconductor memory device having an architecture that provides a fixed CAS latency during a normal mode of operation and various CAS latencies during a test mode of operation.

SUMMARY OF THE INVENTION

The present invention is directed to a semiconductor memory device that provides a fixed column address strobe (CAS) latency during a normal operation mode as well as various CAS latencies in a test mode. In one aspect of the present invention, a semiconductor memory device comprises:
- a master signal generator for generating a master signal in response to one of a power-up signal, a latency test signal and a combination thereof;
- a plurality of fuse information units for generating fuse information signals in response to one of the power-up signal, the master signal and a combination thereof;
- a plurality of mode register set (MRS) address information units which receive address bits during an interval where an address window signal is activated to generate MRS address latch signals in response to a MRS addressing signal; and
- a CAS latency determining unit for generating CAS latency select signals in response to the fuse information signals and the MRS address latch signals, wherein the CAS latency select signals provide one of a fixed CAS latency during first mode of operation of the semiconductor device and varying CAS latencies during a second mode of operation of the semiconductor device.

In another aspect of the present invention, a semiconductor memory device comprises:
- a first circuit for generating a first control signal and a complementary first control signal in response to a power-up signal and a latency test signal;
- a second circuit, responsive to the complementary first control signal, for generating a plurality of second control signals;
- a third circuit, responsive to an address signal, for generating a plurality of third control signals; and
- a fourth circuit, responsive to the first control signal, for selectively processing the second control signals and third control signals to provide one of a fixed CAS latency during a first mode of operation of the semiconductor device and a plurality of CAS latencies during a second mode of operation of the semiconductor device.

In yet another aspect of the invention, a method for providing a CAS latency in a semiconductor memory device comprises the steps of:
- generating a first control signal indicative of a fixed CAS latency;
- generating a second control signal indicative of one of a plurality of non-fixed CAS latencies; and
- selectively processing one of the first and second control signals during one of a first mode of operation of the semiconductor device to provide the fixed CAS latency and a second mode of operation of the semiconductor device to provide one of the non-fixed CAS latencies.

These and other aspects, features, and advantages of the present invention will become apparent from the following detailed description of the preferred embodiments, which is to be read in connection with the accompanying drawings.

DETAILED DESCRIPTION OF PREFERRED EMBODIMENTS

Figure 1:
FIG. 1 illustrates a conventional method of storing CAS latency in a SDRAM.

Preferred embodiments of the present invention will now be described in detail with reference to the accompanying drawings. It is to be understood that similar reference numerals appearing in different drawings represent the same element. Furthermore, the names and labels applied to input and output signals in the following preferred embodiments are for illustrative purposes only, and should not be construed in any manner as a limitation of the invention.

Figure 2:
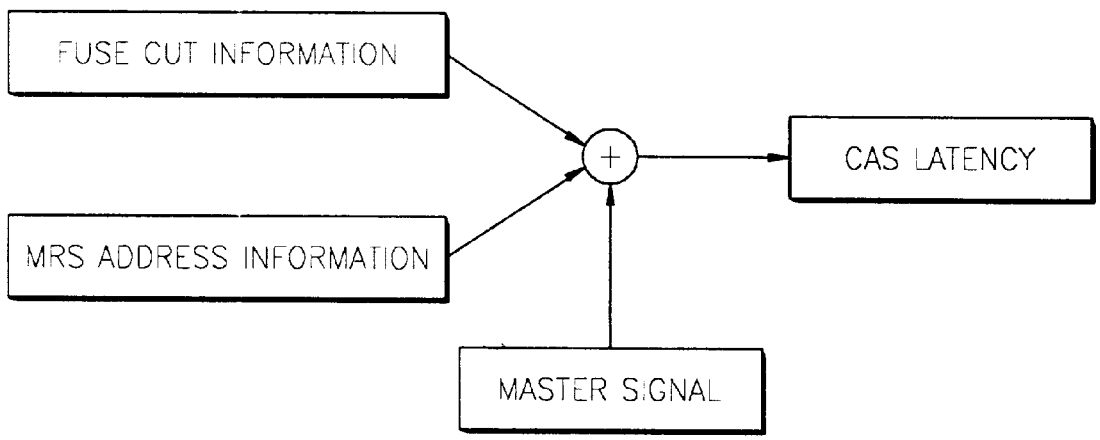
FIG. 2 illustrates a method for defining a CAS latency according to one aspect of the present invention.

Referring now to FIG. 2, a diagram illustrates a method for defining a CAS latency according to one aspect of the present invention. In general, a CAS latency is preferably determined by a combination of fuse cut information, mode register set (MRS) address information, and a master signal. The high-level block diagram of FIG. 3 illustrates a system according to an embodiment of the present invention for implementing the method depicted in FIG. 2.

Figure 3:
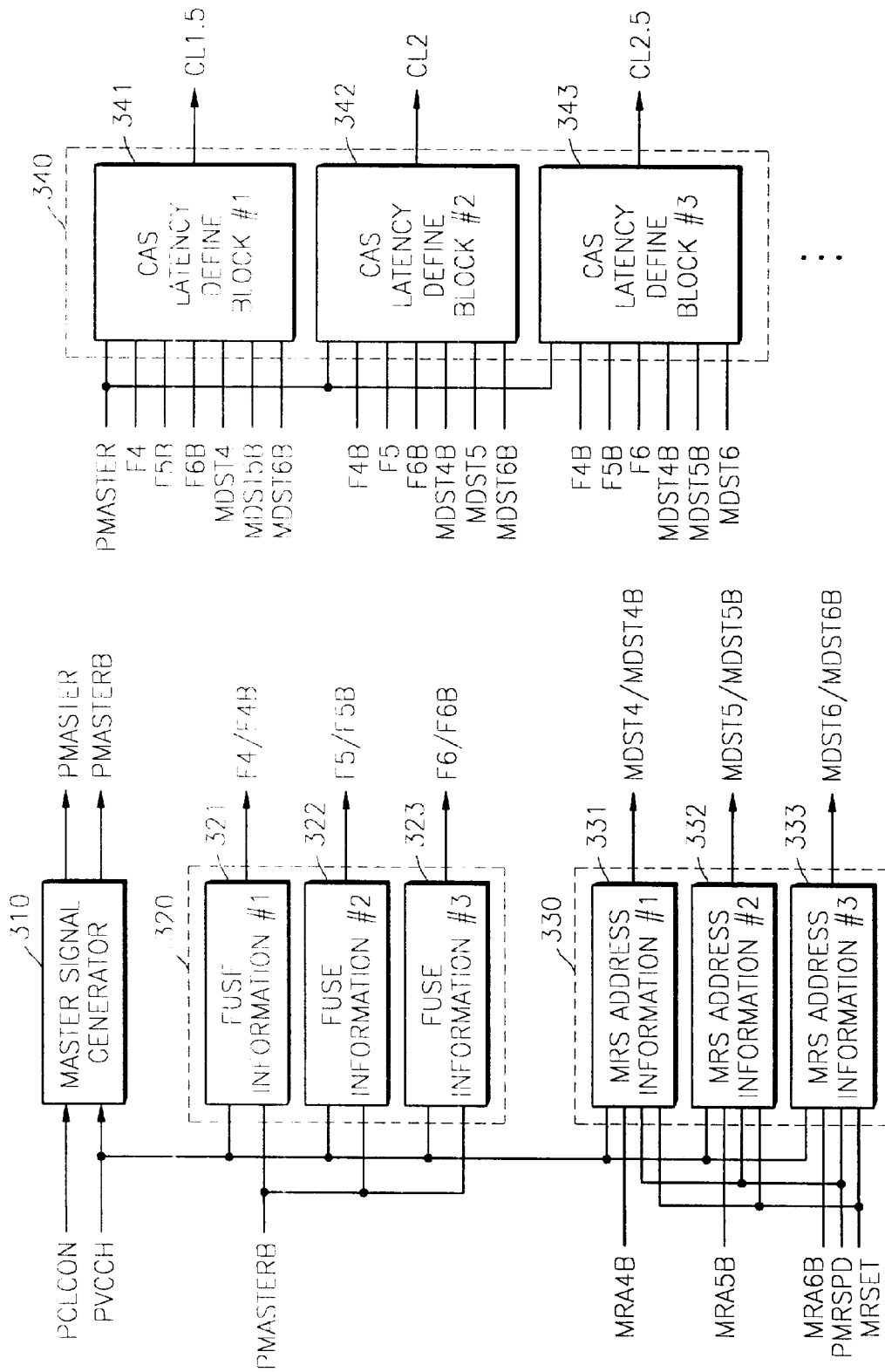
FIG. 3 is a high-level block diagram of a system according to an embodiment of the present invention for defining a CAS latency.

Generally, the system of FIG. 3 comprises a master signal generator 310, a fuse unit 320, a MRS address unit 330, and a CAS latency determining unit 340. The master device generator 310 generates a pair of master signals PMASTER and PMASTERB in response to a power-up signal PVCCH and a latency test signal PCLCON. The fuse unit 320 comprises of a plurality of fuse information units 321, 322, and 323. Each of the fuse information units 321, 322, 323 operate in response to the power-up signal PVCCH and the master signal PMASTERB. As explained below, the fuse information units 321, 322, and 323 operate in different modes depending on whether fuses within such units are cut. The fuse information units 321, 322, and 323 generate fuse information signals F4/F4B, F5/F5B, and F6/F6B, respectively.

The MRS address unit 330 comprises a plurality of MRS address information units 331, 332, and 333. The MRS address information units 331, 332 and 333 operate in response to a MRS address bit MRA4B, MRA5B, or MRA6B, respectively, as well as a window signal PMRSPD (which causes the respective MRS address information unit to accept the address bit MRA4B, MRA5B, or MRA6B) and a MRS addressing signal MRSET. The MRS address information units 331, 332, and 333 generate MRS address latch signals MDST4/MDST4B, MDST5/MDST5B, and MDST6/MDST6B, respectively.

The CAS latency determining unit 340 comprises a plurality of CAS latency define blocks 341, 342, and 343, each of which operate in response to the master signal PMASTER, and certain ones of the fuse information signals F4/F4B, F5/F5B, F6/F6B, and MRS address latch signals MDST4/MDST4B, MDST5/MDST5B, MDST6/MDST6B as illustrated. The CAS latency define blocks 341, 342, and 343 generate CAS latency select signals CL1.5, CL2, and CL2.5, respectively.

Figure 4:
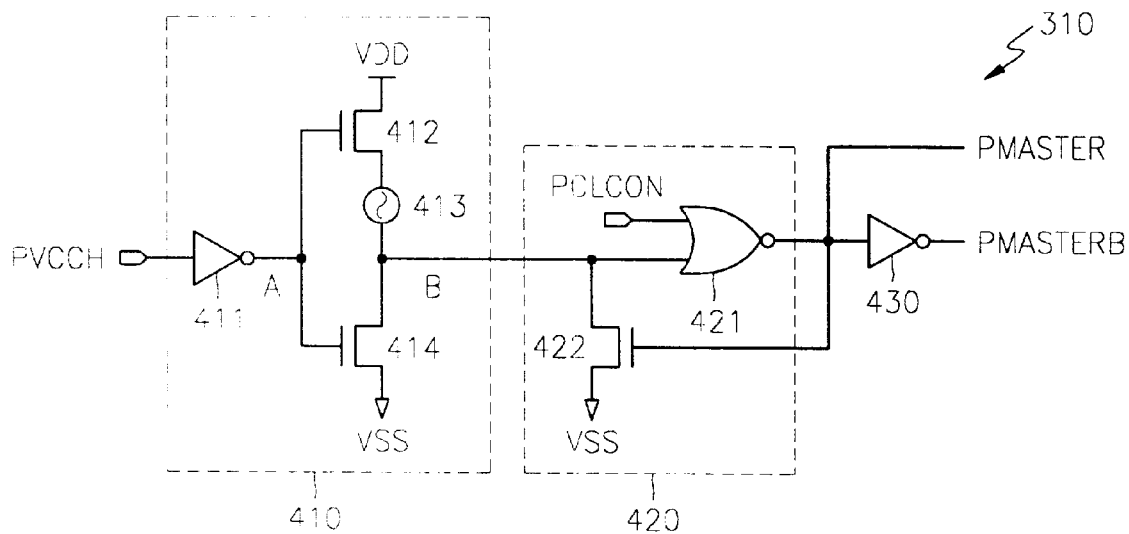
FIG. 4 is a circuit diagram of a master signal generator according to an embodiment of the present invention.

Referring to FIG. 4, a circuit diagram illustrates an architecture of the master signal generator 310 according to an embodiment of the present invention. The master signal generator 310 comprises a fuse coding unit 410, a latency test enable unit 420, and a buffer 430. The fuse coding unit 410 includes an inverter 411, which receives as input the power-up signal PVCCH, a PMOS transistor 412 and an NMOS transistors 414, which are responsive to the output of the inverter 411, and a fuse 413 between the PMOS 412 and NMOS 414 transistors. The latency test enable unit 420 comprises a NOR gate 421, which receives as input the output of the NMOS transistor 414 and the latency test signal PCLCON, and an NMOS transistor 422 which is responsive to the output of the NOR gate 421 and is coupled between the output of the NMOS transistor 414 and a ground voltage VSS. The output of the NOR gate 421 is the master signal PMASTER. The buffer 430 receives as input master signal PMASTER to generate an inverted master signal PMASTERB.

The operation of the master signal generator 310 will now be described with reference to the state in which the fuse 413 within the fuse coding unit 410 is not cut and the state in which the fuse 413 is cut. It is assumed that the power-up signal PVCCH changes from a logic low level (hereinafter referred to as logic "L") to a logic high level (hereinafter referred to as logic "H").

First, in the case in which the fuse 413 is not cut, when the power-up signal PVCCH is at logic "L", node A becomes logic "H", which turns on the NMOS transistor 414 so that node B becomes logic "L". In this case, if the latency test signal PCLCON is logic "L", the output of the NOR gate 421 becomes logic "H" to output the master signal PMASTER as logic "H". The logic "H" of the master signal PMASTER turns on the NMOS transistor 422, which latches logic "L" at node B. The logic "H" of the master signal PMASTER passes through the buffer 430 to generate the inverted master signal PMASTERB of logic "L". If the latency test signal PCLCON is logic "H", the master signal PMASTER (which is the output of the NOR gate 421) becomes logic "L", while the inverted master signal PMASTERB becomes logic "H".

Thereafter, when the power-up signal PVCCH becomes logic "H", node A becomes logic "L", and node B becomes logic "H" through the PMOS transistor 412 and the fuse 413. The master signal PMASTER and the inverted master signal PMASTERB become logic "L" and logic "H", respectively, due to the logic "H" at node B. In this case, the master signal PMASTER is logic "L" and the inverted master signal PMASTERB is logic "H" regardless of the logic level of the latency test signal PCLCON.

Next, in the case in which the fuse 413 is cut, when the power-up signal PVCCH is logic "L", as described above, if the latency test signal PCLCON is logic "L", the master signal PMASTER and the inverted master signal PMASTERB become logic "H" and logic "L", respectively. If the latency test signal PCLCON is logic "H", both the signals become logic "L" and logic "H", respectively. Thereafter, when the power-up signal PVCCH is logic "H", node A becomes logic "L" in response to the logic "H" of the power-up signal PVCCH. The PMOS transistor 412 is turned on in response to the logic "L" at node A, and the supply voltage VDD is transferred to the node B since the fuse 413 has been cut. At this time, the previous level at the node B, that is, logic "L" is latched and maintained by the NMOS transistor 422. Thus, if the latency test signal PCLCON is logic "L", the output of the NOR gate 421 becomes logic "H" to output the master signal PMASTER and the inverted master signal PMASTERB as logic "H" and logic "L", respectively. Here, the master signal PMASTER of logic "H" and the inverted master signal PMASTERB of logic "L" work as signals indicating that the CAS latency is determined by the fuse cut information shown in FIG. 2.

Figure 5:
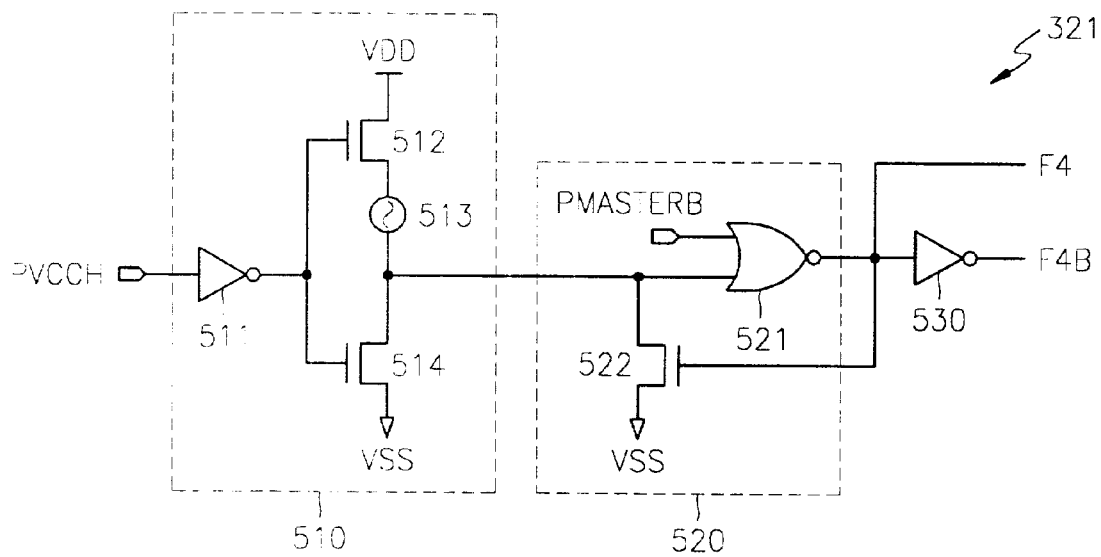
FIG. 5 is a circuit diagram of a fuse information unit according to an embodiment of the present invention.

FIG. 5 is a circuit diagram of a fuse information unit according to an embodiment of the present invention. For illustrative purposes, the architecture of fuse information unit 321 is shown, although it is to be understood that all the fuse information units 321, 322 and 323 in FIG. 3 are preferably similar. Moreover, the fuse information units 321, 322 and 323 are preferably similar in architecture and operation to the master signal generator 310 (FIG. 4) as discussed in detail above. In particular, the fuse information unit 321 comprises a fuse program unit 510, a fuse latency enable unit 520, and a buffer 530. Preferably, the only difference between the master signal generator 310 and the fuse information unit 321 is that the latency test enable unit 420 (FIG. 4) is responsive to the latency test signal PCLCON whereas the fuse latency enable unit 520 is responsive to the inverted master signal PMASTERB. Briefly, the fuse information unit 321 operates as follows. If a fuse 513 is cut, a fuse information signal F4 of logic "H" is generated in response to logic "L" of the inverted master signal PMASTERB. On the other hand, if the fuse 513 is not cut, a fuse information signal F4 of logic "L" is generated independently of the logic level of the inverted master signal PMASTERB. Thus, a fuse information signal F4 of logic "H" indicates that the CAS latency is fixed by the fuse 513.

Figure 6:
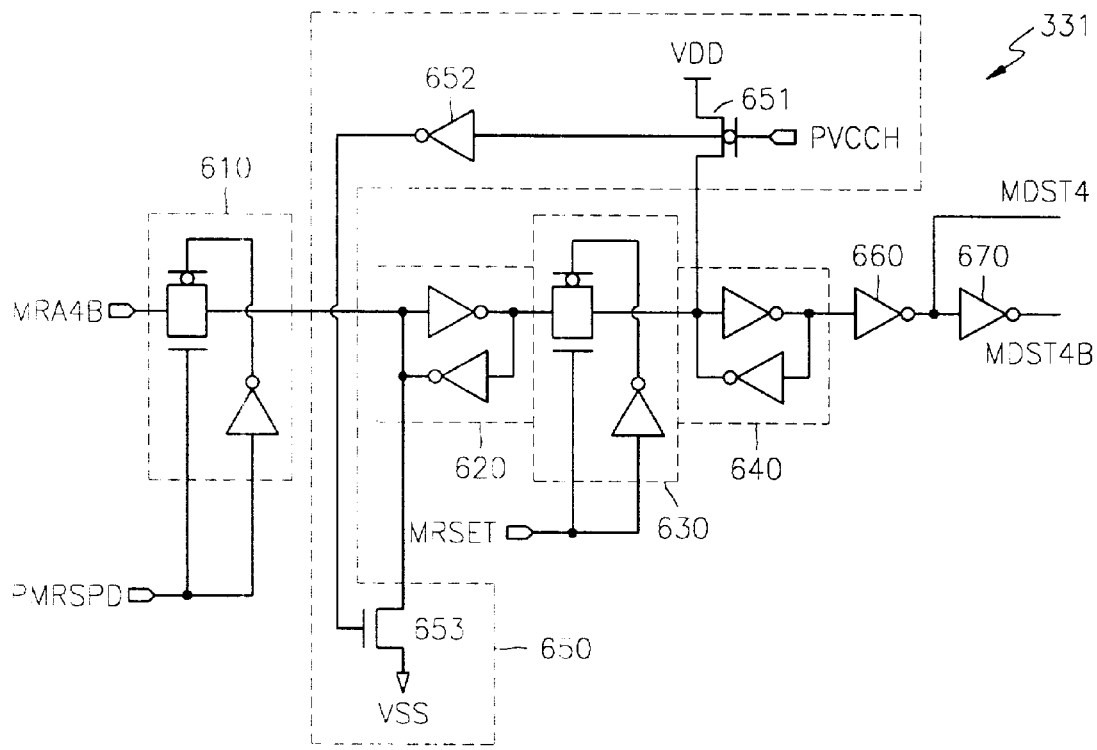
FIG. 6 is a circuit diagram of an address information unit of the mode register set (MRS) according to an embodiment of the present invention.

FIG. 6 is a circuit diagram of a MRS address information unit according to an embodiment of the present invention. For illustrative purposes, the architecture of MRS address information unit 331 is shown, although it is to be understood that all the MRS address information units 331, 332 and 333 of FIG. 3 are preferably similar. The MRS address information unit 331 comprises a first transmitter 610, a first latch 620, a second transmitter 630, and a second latch 640, a setting unit 650, and buffers 660 and 670.

In the setting unit 650, in response to an initial state of logic "L" of the power-up signal PVCCH, the output of an inverter 652 is set to logic "H", causing an NMOS transistor 653 to set the input of the first latch 620 to logic "L". Further, the input of the second latch 640 is set to logic "H" by a PMOS transistor 651. Thereafter, when the power-up signal PVCCH becomes logic "H", the inputs of the first and second latches 620 and 640 are released from the set logic levels. The first transmitter 610 sends the address bit MRA4BB to the first latch 620 in response to an address window signal PMRSPD of logic "H". The first latch 620 latches the logic level of the address bit MRA4BB. Then, the output of the first latch 620, which is an inverted signal of the address bit MRA4BB, is input to the second transmitter 630 connected thereto. The second transmitter 630 sends the output of the first latch 620 to the second latch 640 in response to an MRS addressing signal MRSET. The output of the second latch 640 is an inverted signal of the output of the first latch 620 and, thus, has the same logic level as the address bit MRA4BB. The output of the second latch 640 passes through the buffers 660 and 670 to generate the MRS address latch signals MDST4 and MDST4B as shown.

It is to be appreciated, therefore, that the MRS address information unit 331 inputs the address bit MRA4BB during an interval where the address window signal PMRSPD is activated, and the input address bit MRA4BB is generated as the MRS address latch signals MDST4/MDST4B in response to the MRS addressing signal MRSET.

Figure 7:
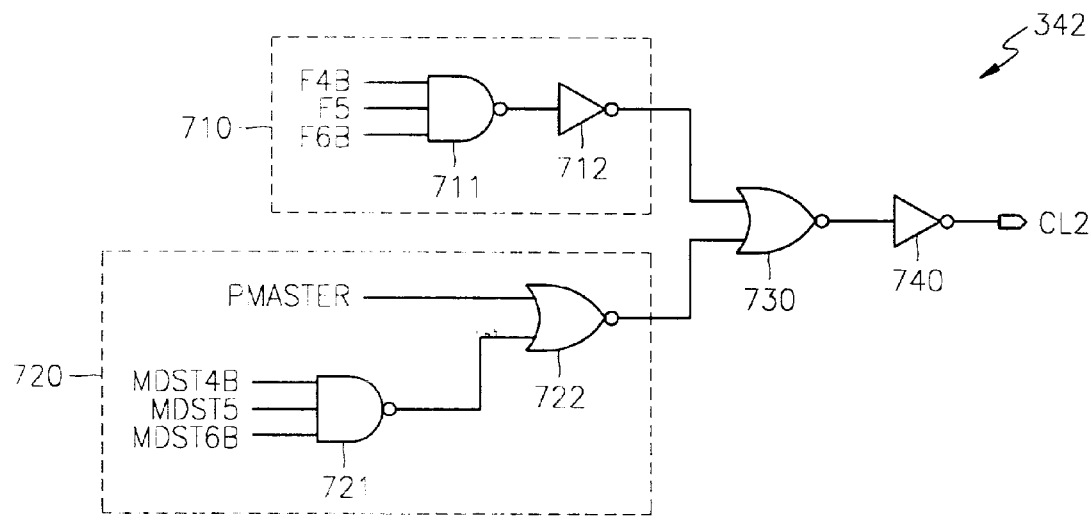
FIG. 7 is a circuit diagram of a CAS latency determining unit according to an embodiment of the present invention.

FIG. 7 is a circuit diagram of a CAS latency define block according to an embodiment of the present invention. For illustrative purposes, the architecture of the CAS latency define block #2 342 (FIG. 3) is shown, although it is to be understood that all the CAS latency define blocks 341, 342 and 343 within the CAS latency determining unit 340 (FIG. 3) are preferably similar in architecture. As shown in FIG. 7, the CAS latency define block #2 342 comprises a fuse coding unit 710, a MRS address coding unit 720, a determining unit 730, and a driver 740. The fuse coding unit 710 outputs the encoded result of the fuse information signals F4B, F5, and F6B input to a NAND gate 711 through an inverter 712. The MRS address coding unit 720 outputs the encoded result of the MRS address latch signals MDST4B, MDST5, and MDST6B received from a NAND gate 721 when the master signal PMASTER is logic "L". If the master signal PMASTER is logic "H", the output of a NOR gate 722 becomes logic "L" regardless of the encoded result of the MRS address latch signals MDST4B, MDST5, and MDST6B. In this case, the output of the determining unit 730 is determined by the output of the fuse coding unit 710, and the determining unit 730 outputs the CAS latency CL2 through an inverter which is the driver 740. On the other hand, if the master signal PMASTER is logic "L", the determining unit 730 determines the CAS latency CL2 based on the output of the fuse coding unit 710 and the encoded result of the MRS address latch signals MDST4B, MDST5, and MDST6B.

Advantageously, a semiconductor memory device having components described herein allows a CAS latency to be fixed by the output of the fuse coding unit 710 during normal operation and to be variously tested by the combinations of the MRS address information during a test mode.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A semiconductor memory device, comprising:
   a master signal generator for generating a master signal in response to one of a power-up signal and a latency test signal;
   a plurality of fuse information units for generating fuse information signals in response to one of the power-up signal, the master signal and a combination thereof;
   a plurality of mode register set (MRS) address information units which receive address bits during an interval where an address window signal is activated to generate MRS address latch signals in response to a MRS addressing signal; and
   a CAS latency determining unit for generating CAS latency select signals in response to the fuse information signals and the MRS address latch signals, wherein the CAS latency select signals provide one of a fixed CAS latency during first mode of operation of the semiconductor device and varying CAS latencies during a second mode of operation of the semiconductor device.

2. The semiconductor memory device of claim 1, wherein the master signal generator comprises:
   a fuse program unit responsive to the power-up signal, wherein the fuse program unit comprises a first fuse for programming the fuse program unit;
   a latency test enable unit for generating the master signal in response to the output of the fuse program unit and the latency test signal; and
   a buffer for generating an inverted signal of the master signal.

3. The semiconductor memory device of claim 2, wherein the fuse program unit further comprises:
   an inverter for receiving the power-up signal;
   a PMOS transistor, operatively coupled between a supply voltage and the first fuse, responsive to the output of the inverter; and
   an NMOS transistor, operatively coupled between a ground voltage and the first fuse, which generates an output signal of the fuse program unit in response to the output of the inverter.

4. The semiconductor memory device of claim 2, wherein the latency test enable unit comprises:

a NOR gate which generates the master signal in response to an output of the fuse program unit and the latency test signal; and an NMOS transistor, operatively coupled between the output of the fuse program unit and a ground voltage, and being responsive to the master signal.

5. The semiconductor memory device of claim 1, wherein each fuse information unit comprises:

a fuse program unit responsive to the power-up signal, wherein the fuse program unit comprises a second fuse for programming the fuse program unit;

a fuse information signal generator for generating the fuse information signal in response to the output of the fuse program unit and the master signal; and a buffer for generating an inverted signal of the fuse information signal.

6. The semiconductor memory device of claim 5, wherein the fuse program unit further comprises:

an inverter for receiving the power-up signal;

a PMOS transistor, operatively coupled between a supply voltage and the second fuse, responsive to the output of the inverter; and an NMOS transistor, operatively coupled between a ground voltage and the second fuse, for generating the output signal of the fuse program unit in response to the output of the inverter.

7. The semiconductor memory device of claim 5, wherein the fuse information signal generator comprises:

a NOR gate for generating the fuse information signal in response to the output of the fuse program unit and the master signal; and an NMOS transistor, operatively coupled between the output of the fuse program unit and a ground voltage, responsive to the fuse information signal.

8. The semiconductor memory device of claim 1, wherein each MRS address information unit comprises:

a first transmitter for transmitting an address bit in response to the address window signal;

a first latch for latching the output of the first transmitter;

a second transmitter for transmitting the output of the first latch in response to the MRS addressing signal;

a second latch for latching the output of the second transmitter; and a buffer for generating the MRS address latch signal in response to the output of the second latch.

9. The semiconductor memory device of claim 8, wherein each MRS address information unit further comprises a setting unit for initializing the first and second latches in response to an initial state of the power-up signal.

10. The semiconductor memory device of claim 1, wherein the CAS latency determining unit comprises:

a fuse coding unit for encoding the fuse information signals;

an MRS address coding unit for encoding the MRS address information signals and outputting the encoded result in response to the master signal; and a determining unit for generating a CAS latency in response to the output of the fuse coding unit and the MRS address coding unit.

11. The semiconductor memory device of claim 10, wherein the fuse coding unit comprises:

a NAND gate for receiving the fuse information signals; and an inverter, connected to the output of the NAND gate, for generating an output signal of the fuse coding unit.

12. The semiconductor memory device of claim 10, wherein the MRS address coding unit comprises:

a NAND gate for receiving the MRS address latch signals; and a NOR gate for generating an output signal of the MRS address coding unit in response to the output of the NAND gate and the master signal.

13. The semiconductor memory device of claim 10, wherein the determining unit generates the CAS latency in response to the output of the fuse coding unit and the output of the MRS address coding unit.

14. A semiconductor memory device, comprising a first circuit for generating a first control signal and a complementary first control signal in response to a power-up signal and a latency test signal;

a second circuit, responsive to the complementary first control signal, for generating a plurality of second control signals;

a third circuit, responsive to an address signal, for generating a plurality of third control signals; and a fourth circuit, responsive to the first control signal, for selectively processing the second control signals and third control signals to provide one of a fixed CAS latency during a first mode of operation of the semiconductor device and a plurality of CAS latencies during a second mode of operation of the semiconductor device.

15. The semiconductor memory device of claim 14, wherein the first and second circuits are fuse programmable.

16. The semiconductor memory device of claim 14, wherein the third circuit comprises a MRS (mode set register) address circuit.

17. The semiconductor memory device of claim 14, wherein the second control signals are indicative of a fixed CAS latency.

18. The semiconductor memory device of claim 14, wherein the third control signals are indicative of a dynamically selected CAS latency.

19. A method for providing a CAS latency in a semiconductor memory device, comprising the steps of:

generating a first control signal indicative of a fixed CAS latency;

generating a second control signal indicative of one of a plurality of non-fixed CAS latencies;

selectively processing one of the first and second control signals during one of a first mode of operation of the semiconductor device to provide the fixed CAS latency and a second mode of operation of the semiconductor device to provide one of the non-fixed CAS latencies.

* * * * *